(12) United States Patent
Ma et al.

(10) Patent No.: US 6,504,775 B1
(45) Date of Patent: Jan. 7, 2003

(54) BITLINE PRECHARGE

(75) Inventors: Peter P Ma, Ottawa (CA); Abdullah Ahmed, Scarborough (CA); Valerie L Lines, Ottawa (CA)

(73) Assignee: Mosaid Technologies Incorporated Kanata, Ontario (CA)

( * ) Notice: Subject to any disclaimer, the term of this patent is extended or adjusted under 35 U.S.C. 154(b) by 0 days.

(21) Appl. No.: 09/956,917

(22) Filed: Sep. 21, 2001

(30) Foreign Application Priority Data

Apr. 30, 2001 (CA) .............................................. 2345845

(51) Int. Cl.$^7$ ................................................ G11C 7/00
(52) U.S. Cl. ...................................... 365/203; 365/154
(58) Field of Search ............................... 365/203, 207, 365/205, 154, 189.04, 189.11

(56) References Cited

U.S. PATENT DOCUMENTS

| | | | | |
|---|---|---|---|---|
| 5,327,372 A | * | 7/1994 | Oka et al. ............... | 365/189.05 |
| 5,391,938 A | * | 2/1995 | Hatsuda ........................ | 326/52 |
| 5,598,115 A | * | 1/1997 | Holst .......................... | 326/113 |
| 5,602,770 A | | 2/1997 | Ohira | |
| 5,646,878 A | * | 7/1997 | Samra .................... | 365/189.07 |
| 5,673,219 A | | 9/1997 | Hashimoto | |
| 5,745,423 A | | 4/1998 | Tai | |
| 5,930,178 A | | 7/1999 | Hsu et al. | |

OTHER PUBLICATIONS

Lines V. et al: "66MHZ 2.3M Ternary Dynamic Content Addressable Memory", Records of the International Workshop on Memory Technology, Design and Testing, XX, XX, Aug. 8, 2000, pp. 101–105, XP001023484, p. 103, left–hand column, paragraph 3.2. right–hand column, paragraph 3.3 Figure 3.

* cited by examiner

Primary Examiner—Richard Elms
Assistant Examiner—Anh Phung
(74) Attorney, Agent, or Firm—L. Anne Kinsman; Borden Ladner Gervais LLP (57) ABSTRACT

An architecture and method for fast precharge of bitlines in a densely packed, dynamic content addressable memory is disclosed. The dynamic content addressable memory cells are arranged according to an open bitline architecture to obtain high packing density. The bitlines are precharged through equalization between every two adjacent open bitline pairs. More specifically, a bitline and its adjacent neighbouring bitline on the same side of the bitline sense amplifiers are equalized at several locations along the bitlines such that they are equalized at high speed, which is typically not available in open bitlines architectures. Hence the adjacent bitlines are precharged in a manner similar to a folded bitline architecture. Additional equalization circuits are connected between the complementary bitlines of each open bitline pair, therefore during the precharge phase, all four bitlines of the two open bitline pairs are equalized with each other. To ensure that all four bitlines equalize to the midpoint voltage level, complementary logic levels are written to the bitlines prior to equalization.

5 Claims, 7 Drawing Sheets

BITLINE PRECHARGE

FIELD OF THE INVENTION

The present invention relates to content addressable memory (CAM). In particular, the present invention relates to a circuit and method for high speed precharging of bitlines in an open bitline architecture CAM device.

BACKGROUND OF THE INVENTION

In many conventional memory systems, such as random access memory, binary digits (bits) are stored in memory cells, and are accessed by a processor that specifies a linear address that is associated with the given cell. This system provides rapid access to any portion of the memory system within certain limitations. To facilitate processor control, each operation that accesses memory must declare, as a part of the instruction, the address of the memory cell/cells required. Standard memory systems are not well designed for a content based search. Content based searches in standard memory require software based algorithmic search under the control of the microprocessor. Many memory operations are required to perform a search. These searches are neither quick nor efficient in using processor resources.

To overcome these inadequacies an associative memory system called Content Addressable Memory (CAM) has been developed. CAM allows cells to be referenced by their contents, so it has first found use in lookup table implementations such as cache memory subsystems and is now rapidly finding use in networking systems. CAM's most valuable feature is its ability to perform a search and compare of multiple locations as a single operation, in which search data is compared with data stored within the CAM. Typically search data is loaded onto search lines and compared with stored words in the CAM. During a search-and-compare operation, a match or mismatch signal associated with each stored word is generated on a matchline, indicating whether the search word matches a stored word or not. A typical word of stored data includes actual data with a number appended header bits, such as an "E" bit or empty bit for example, although the header bits are not specifically searched during search-and-compare operations.

A CAM stores data in a matrix of cells, which are generally either SRAM based cells or DRAM based cells. Until recently, SRAM based CAM cells have been most common because of their simple implementation. However, to provide ternary state CAMs, ie. where the search and compare operation returns a "0", "1"or "don't care" result, ternary state SRAM based cells typically require many more transistors than a DRAM based cells. As a result, ternary state SRAM based CAMs have a much lower packing density than ternary DRAM cells.

Figure 1:
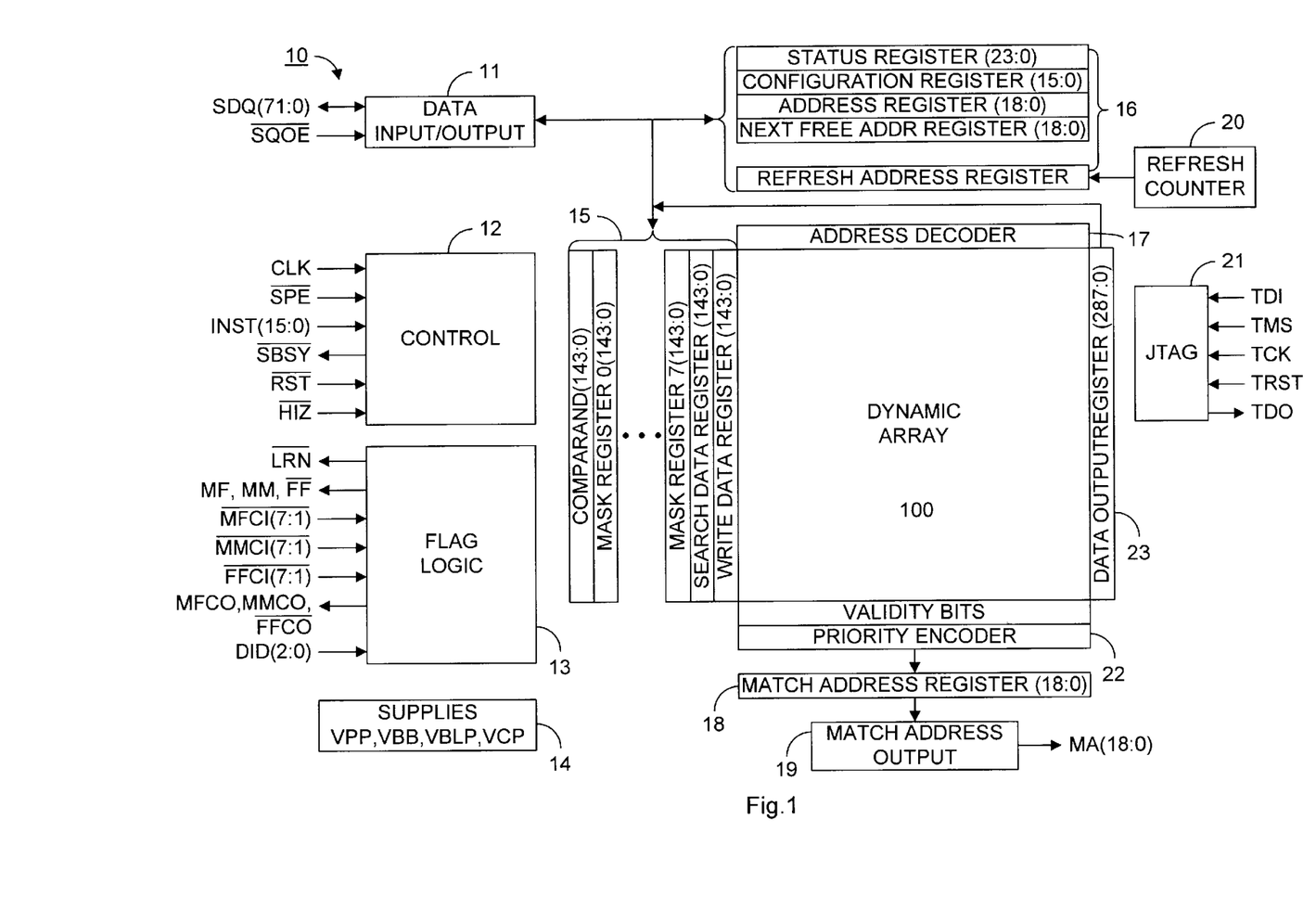
FIG. 1 shows a block diagram of a CAM according to an embodiment of the present invention.

A typical CAM block diagram is shown in FIG. 1. The CAM 10 includes a matrix, or array 100, of DRAM based CAM cells (not shown) arranged in rows and columns. An array of DRAM based ternary CAM cells have the advantage of occupying significantly less silicon area than their SRAM based counterparts. A predetermined number of CAM cells in a row store a word of data. An address decoder 17 is used to select any row within the CAM array 100 to allow data to be written into or read out of the selected row. Data access circuitry such as bitlines and column selection devices, are located within the array 100 to transfer data into and out of the array 100. Located within CAM array 100 for each row of CAM cells are matchline sense circuits, which are not shown, and are used during search-and-compare operations for outputting a result indicating a successful or unsuccessful match of a search word against the stored word in the row. The results for all rows are processed by the priority encoder 22 to output the address (Match Address) corresponding to the location of a matched word. The match address is stored in match address registers 18 before being output by the match address output block 19. Data is written into array 100 through the data I/O block 11 and the various data registers 15. Data is read out from the array 100 through the data output register 23 and the data I/O block 11. Other components of the CAM include the control circuit block 12, the flag logic block 13, the voltage supply generation block 14, various control and address registers 16, refresh counter 20 and JTAG block 21.

Figure 2:
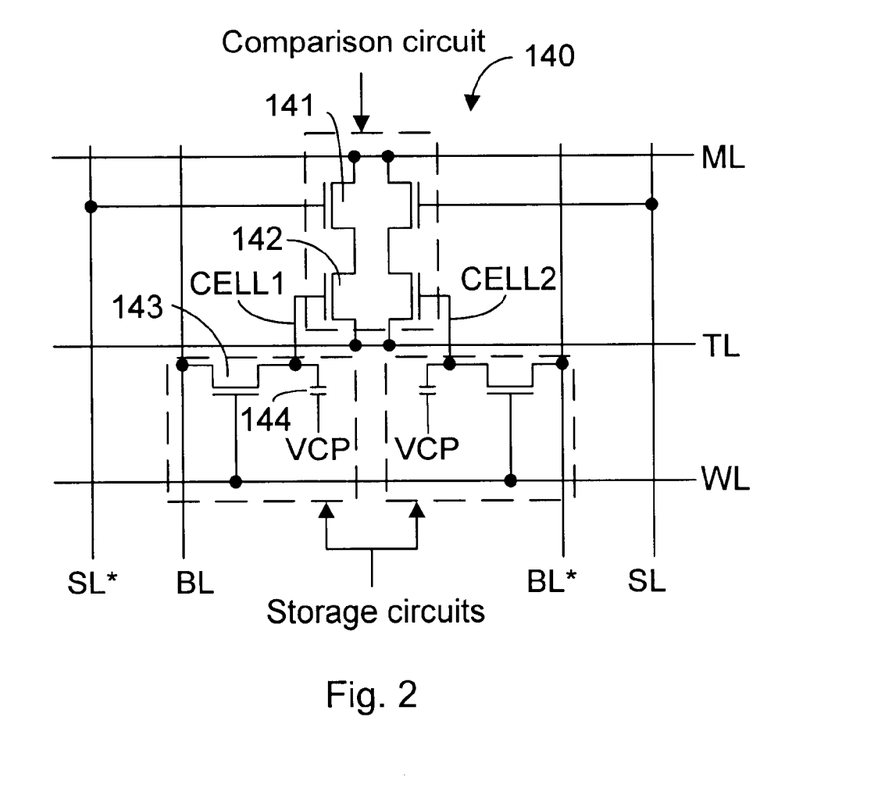
FIG. 2 shows a schematic of a DRAM based CAM cell.

FIG. 2 shows a typical ternary DRAM type CAM cell 140 as described in Canadian Patent Application No. 2,266,062, filed Mar. 31, 1999, the contents of which are incorporated herein by reference. Cell 140 has a comparison circuit which includes an n-channel search transistor 141 connected in series with an n-channel compare transistor 142 between a matchline ML and a tail line TL. A search line SL* is connected to the gate of search transistor 141. The storage circuit includes an n-channel access transistor 143 having a gate connected to a wordline WL and connected in series with capacitor 144 between bitline BL and a cell plate voltage potential VCP. Charge storage node CELL1 is connected to the gate of compare transistor 142 to turn on transistor 142 if there is charge stored on capacitor 144 i.e. if CELL1 is logic "1". The remaining transistors and capacitor replicate transistors 141, 142, 143 and capacitor 144 for the other half of the ternary data bit, and are connected to corresponding lines SL and BL* and are provided to support ternary data storage. Together they can store a ternary value representing logic "1", logic "0", or "don't care".

| Ternary Value | CELL1 | CELL2 |
|---|---|---|
| 0 | 0 | 1 |
| 1 | 1 | 0 |
| "Don't Care" | 0 | 0 |

The tail line TL is typically connected to ground and all the transistors are n-channel transistors. The description of the operation of the ternary DRAM cell is detailed in the aforementioned reference.

As previously mentioned, memory array 100 uses DRAM type memory cells to attain a higher density of cells per unit area of silicon, which has the benefit of reducing the overall cost of manufacturing. However, within the field of DRAM memory, there are two well known architectures used for arranging the memory cells and bitlines, which when applied to the ternary CAM of the present invention, each provide distinct advantages and disadvantages to the CAM device.

Figure 3:
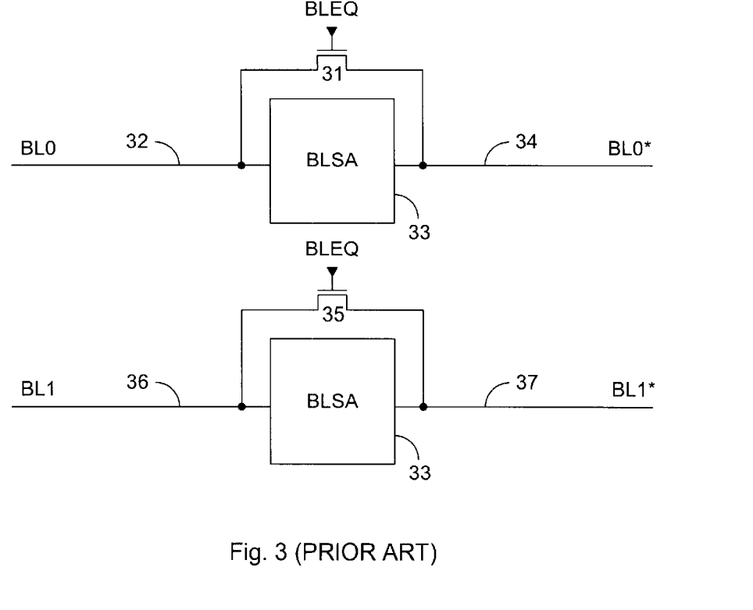
FIG. 3 illustrates an open bitline architecture of the prior art.

The first architecture is the open bitline architecture, generally shown in FIG. 3. The arrangement shown in FIG. 3 is representative of the physical layout of the bitlines with respect to the bitline sense amplifier (BLSA) on a fabricated device. Wordlines, memory cells and read/write circuits are intentionally omitted to simplify the schematic. But it will be understood by those skilled in the art that wordlines would run perpendicular to the bitlines, memory cells would be located near the intersection between each wordline and bitline, and read/write circuits are coupled to the bitlines. Complementary bitlines 32 and 34 extend away from the left and right sides of the bitline sense amplifier (BLSA) 33. A bitline sense amplifier such as BLSA 33 is well known in the art and typically includes a pair of cross-coupled complementary pair of CMOS transistors. An n-channel equalization transistor 31 is connected between bitlines 32 and 34 for electrically shorting the two bitlines together, and has a gate controlled by a bitline equalization signal BLEQ. Bitlines 32 and 34, equalization transistor 31 and BLSA 33 form one open bitline pair. Another bitline pair consisting of bitlines 36 and 37, equalization transistor 35 and BLSA 38 are configured identically to their corresponding elements from the first open bitline pair. In a memory array, a plurality of open bitline pairs are arranged one below the other as shown in FIG. 3, in which all the bitlines connected to the left side of the BLSA's are part of the left sub-array and all the bitlines connected to the right side of the BLSA's are part of the right sub-array. For DRAM memories, it is necessary to precharge bitlines, through bitline precharge transistors (not shown), to a mid-point potential level prior to reading data from a DRAM memory cell connected to it. This mid-point potential level is typically half the high power supply potential used by the bitline sense amplifiers. This is to allow the bitline sense amplifier to detect small changes in the potential level of the bitline when charge is added or removed by the memory cell storage capacitor.

A brief discussion of a read and precharge operation for the open bitline architecture of FIG. 3 follows. It is assumed that all bitlines have been precharged to a mid-point potential level between a high and a low logic potential level in a previous operation. During a read operation, one wordline of either the left or right sub-array is driven to access one memory cell connected to each bitline of the respective sub-array. The bitlines of the unaccessed sub-array remain at the mid-point potential level, which is the reference potential level used by the BLSA during sensing of the data on the bitlines of the accessed sub-array. The BLSA detects the shift in the potential level of the bitline when the storage capacitor of the accessed memory cell is coupled to the bitline, and amplifies and latches the full CMOS logic potential level of the bitline. Since BLSA is a cross-coupled latch circuit, the accessed bitline and its corresponding complementary bitline are driven to opposite logic potential levels after the data has been read out, and since the selected wordline remains activated, the full CMOS level is restored into the accessed cell.

To precharge the bitlines in preparation for the next read operation, control signal BLEQ is driven to the high logic level to turn on all equalization transistors and short each complementary pair of bitlines together. The bitlines having the high logic potential level will equalize with the bitlines having the low logic potential level through charge sharing, such that both reach a mid-point potential level.

The open bitline architecture allows for efficient packing of ternary CAM memory cells to reduce the overall area occupied by the memory array. One disadvantage of the open bitline architecture is unbalanced bitlines due to capacitive coupling of an active wordline to only one bitline of the complementary pair of bitlines. The bitline acting as a reference bitline is not crossed by an active wordline, thus it is not disturbed in the same way as the bitline crossing an active wordline. Therefore potential read errors may result. Another more significant disadvantage is the slow precharge speed. As memory densities grow, the bitlines become longer, which inherently have more resistance and capacitance than shorter bitlines. The precharge and equalization speed of the bitlines could be improved if an additional equalization transistor was connected between the two farthest ends of the complementary bitlines, instead of just at the two closest ends as shown in FIG. 3. However, it is impractical to add such an additional equalization transistor. The metal lines for connecting such an additional equalization transistor would be as long as the bitlines, hence contributing more capacitance to the system. Therefore, when equalization is slow, the overall access speed of the CAM becomes slow, which restricts the CAM from being used in high speed applications.

Figure 4:
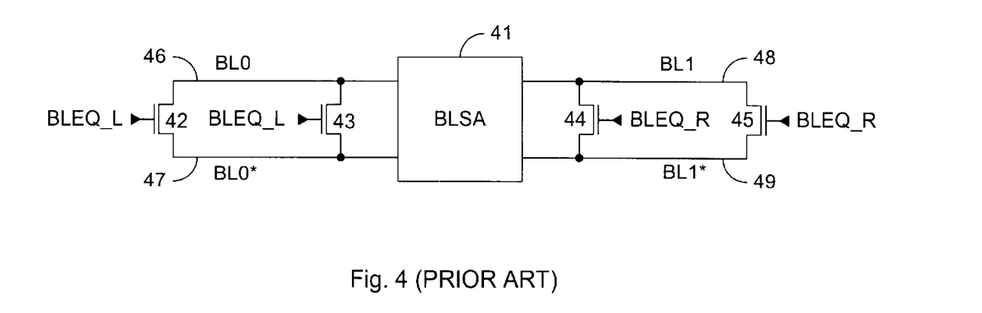
FIG. 4 illustrates a folded bitline architecture of the prior art.

The second architecture is the folded bitline architecture, generally shown in FIG. 4. The arrangement shown in FIG. 4 is representative of the physical layout of the bitlines with respect to the bitline sense amplifier (BLSA) on a fabricated device. Wordlines, memory cells and read/write circuits are intentionally omitted to simplify the schematic. But it will be understood by those skilled in the art that wordlines would run perpendicular to the bitlines, memory cells would be located near the intersection between each wordline and bitline, and read/write circuits are coupled to the bitlines. Complementary bitlines 46 and 47 extend away from the left side of a shared bitline sense amplifier (BLSA) 41, and complementary bitlines 48 and 49 extend away from the right side of BLSA 41. A shared bitline sense amplifier such as BLSA 41 is well known in the art, and would typically consist of a pair of cross-coupled complementary pair of CMOS transistors. N-channel equalization transistors 42 and 43 are connected between bitlines 46 and 47 at opposite ends of bitlines 46 and 47. Similarly, n-channel equalization transistors 44 and 45 are connected between bitlines 48 and 49 at opposite ends of bitlines 48 and 49. Equalization transistors 42 and 43 have gates controlled by a left sub-array bitline equalization signal BLEQ_L, and equalization transistors 44 and 45 have gates controlled by a right sub-array bitline equalization signal BLEQ_R. In a typical array, a shared BLSA and respective pairs of folded bitlines are arranged in a column, and several columns can be arranged side by side. In FIG. 4, bitlines 46 and 47 and equalization transistors 42 and 43 are located within a left sub-array, and bitlines 48 and 49 and equalization transistors 44 and 45 are located within a right sub-array.

A brief discussion of a read and precharge operation for the folded bitline architecture of FIG. 4 follows. It is assumed that all bitlines have been precharged to a mid-point potential level between a high and a low logic potential level in a previous operation. During a read operation, one wordline of either the left or right sub-array is driven to access one memory cell connected each bitline, BL0 or BL0* for example, of the respective sub-array, and the corresponding equalization control signal, BLEQ_L or BLEQ_R is turned off. The folded complementary bitlines of the unaccessed sub-array, BL1 and BL1* for example, remain at the precharged mid-point potential level. If a memory cell connected to BL0 is accessed by the driven wordline, then the complementary bitline BL0* remains at the precharged mid-point potential level, which is the reference potential level used by BLSA 41. Accordingly, the role of each bitline is reversed if a memory cell connected to BL0* is accessed instead of a memory cell connected to BL0. Furthermore, the roles of both folded bitline pairs is reversed if a driven wordline accesses a memory cell connected to either BL1 or BL1*. Since BLSA is a cross-coupled latch circuit, the accessed bitline and its corresponding complementary bitline are driven to opposite logic potential levels after the data has been read out. To precharge the bitlines in preparation for the next read operation, the equalization signal (BLEQ_L or BLEQ_R) for the accessed sub-array is driven to the high logic level to turn on its respective equalization transistors. The bitlines having the high logic potential level will equalize with the bitlines having the low logic potential level through charge sharing, such that both reach a mid-point potential level. The bitlines of the unaccessed sub-array remain precharged throughout the read operation. Because equalization transistors 42, 43 and 44, 45 are placed near the two extremities of their respective folded bitline pairs, the time required for equalization is short when compared to the equalization speed of the open bitline architecture shown in FIG. 3.

Given that the bitlines of FIGS. 3 and 4 are the same length and width, the time constant for each bitline in FIG. 3 is expressed as τopen=RC, where R is the lumped resistance and C is the lumped capacitance of the bitline. Each bitline of FIG. 4 has half the resistance and capacitance of a bitline of FIG. 3 due to the additional equalization transistor placed at the extremities of the folded bitlines. Therefore, relative to the bitlines of FIG. 3, the time constant is expressed as $$\tau folded = \frac{R}{2}\frac{C}{2}.$$

Accordingly, the time required for equalizing a bitline of FIG. 4 is approximately four times faster than the time required for equalizing a bitline of FIG. 3.

There exist precharge schemes in which equalization transistors are not used for precharging bitlines to a mid-point potential level. Instead, a precharge voltage is supplied directly to the bitlines. Unfortunately, the circuit for generating such a precharge voltage must be of high quality, which is difficult to design and is subject to variations in the semiconductor fabrication process.

Despite the precharge speed advantage of the folded bitline architecture over the open bitline architecture, the folded bitline architecture does not allow efficient packing of ternary dynamic CAM cells. For highest packing density, ternary dynamic CAM cells are arrayed as a single line of cells under a common wordline node as well as a common matchline node. As such, adjacent bitlines are necessarily active during row access operations. This excludes the use of a folded bitline architecture which requires adjacent bitlines to act as precharge-level references. However, a ternary dynamic CAM memory array employing an open bitline architecture is not suitable for high speed applications due to its slower precharge speed.

It is therefore desirable to provide a ternary dynamic CAM memory array architecture which operates at high speed and arranged with an efficient packing density to occupy small silicon area.

SUMMARY OF THE INVENTION

It is an object of the present invention to obviate or mitigate at least one disadvantage of previous ternary dynamic CAM memory array architectures. In particular, it is an object of the present invention to provide a ternary dynamic CAM memory array architecture that operates at high speed and occupies a small silicon area.

In a first aspect, the present invention provides a bitline precharge circuit for equalizing a first and second bitline. The circuit includes a bitline overwrite circuit for writing preset complementary logic potential levels onto the first and second bitlines, and an equalization circuit for shorting together the first and second bitlines after the preset complementary logic potential levels are written onto the first and second bitlines.

In further embodiments of the present aspect, the bitline overwrite circuit includes bitline write drivers connected to respective databuses, or a local bitline write circuit. In another aspect of the present alternate embodiment, the local bitline write circuit includes a transistor for coupling the first bitline to a low logic potential level and a transistor for coupling the second bitline to a high logic potential level.

In yet another alternate embodiment of the present aspect, the equalization circuit includes at least one equalization transistor connected between the first and second bitlines, or two equalization transistors connected between the first and second bitlines, where the first and second equalization transistors are connected at opposite ends of the first and second bitlines, respectively.

In another aspect, the present invention provides a bitline architecture for a ternary content addressable memory. The bitline architecture includes a first bitline sense amplifier connected to first and second complementary bitlines arranged in an open bitline configuration, a second bitline sense amplifier connected to third and fourth complementary bitlines arranged in an open bitline configuration, ternary content addressable memory cells for storing two bits of data connected to the first and third bitlines, ternary content addressable memory cells for storing two bits of data connected to the second and fourth bitlines, a first bitline overwrite circuit for writing preset complementary logic potential levels onto the first and third bitlines, a second bitline overwrite circuit for writing preset complementary logic potential levels onto the second and fourth bitlines, a first precharge circuit for equalizing the first and third bitlines, and a second precharge circuit for equalizing the second and fourth bitlines.

In an alternate embodiment of the present aspect, the first and second bitline sense amplifiers include CMOS cross coupled inverters. In another alternate embodiment of the present aspect, the ternary content addressable memory cells are ternary DRAM type CAM cells.

In a further aspect of the present invention, there is provided a content addressable memory. The content addressable memory consists of content addressable memory cells arranged in rows and columns, each cell having a first and second bitline, a bitline overwrite circuit for each pair of first and second bitlines for writing preset complementary logic potential levels onto the first and second bitlines, an equalization circuit for each pair of first and second bitlines for shorting together the first and second bitlines after the preset complementary logic potential levels are written onto the first and second bitlines, an address decoder for addressing rows of cells, write data circuitry for writing data to the cells, and read circuitry for reading data from the cells.

In yet another aspect of the present invention, there is provided a method for precharging first and second bitlines in a content addressable memory. The method consists of writing preset complementary logic potential levels onto the first and second bitlines, and equalizing the first and second complementary signal lines.

BRIEF DESCRIPTION OF THE DRAWINGS

Embodiments of the present invention will now be described, by way of examples only, with referenced to the attached Figures, wherein.

DETAILED DESCRIPTION

Generally, the present invention provides a bitline architecture and method for fast equalization of bitlines in a densely packed, ternary dynamic content addressable memory. More specifically, the bitline architecture of the present invention is a hybrid architecture combining the high density of open bitline architectures and the fast precharge speed of folded bitline architectures. Data read and write operations are performed in a manner consistent with traditional open bitline architectures, but bitline precharge and equalization is performed in a manner consistent with traditional folded bitline architectures.

Figure 5:
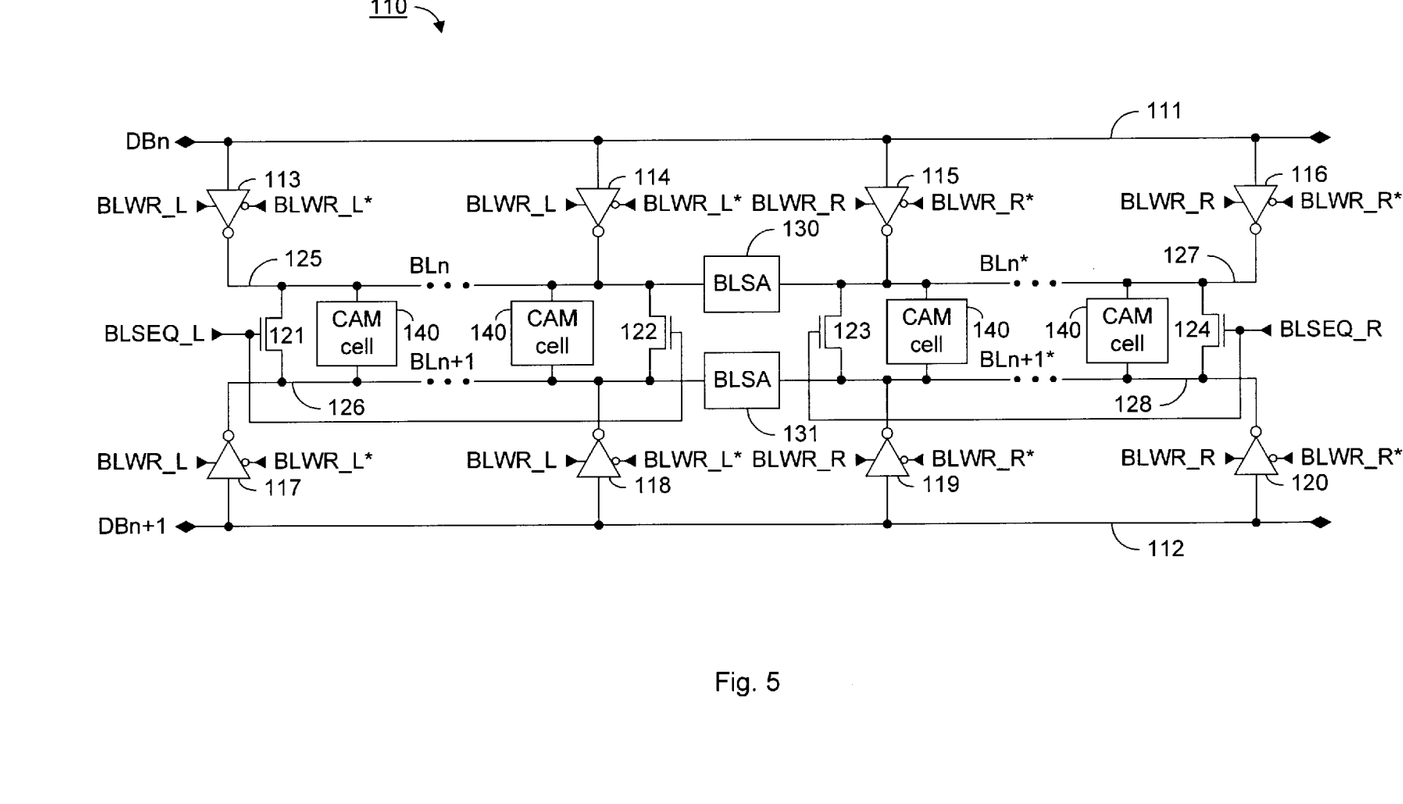
FIG. 5 illustrates a generic bitline precharge and equalize architecture according to the invention.
Figure 6A:
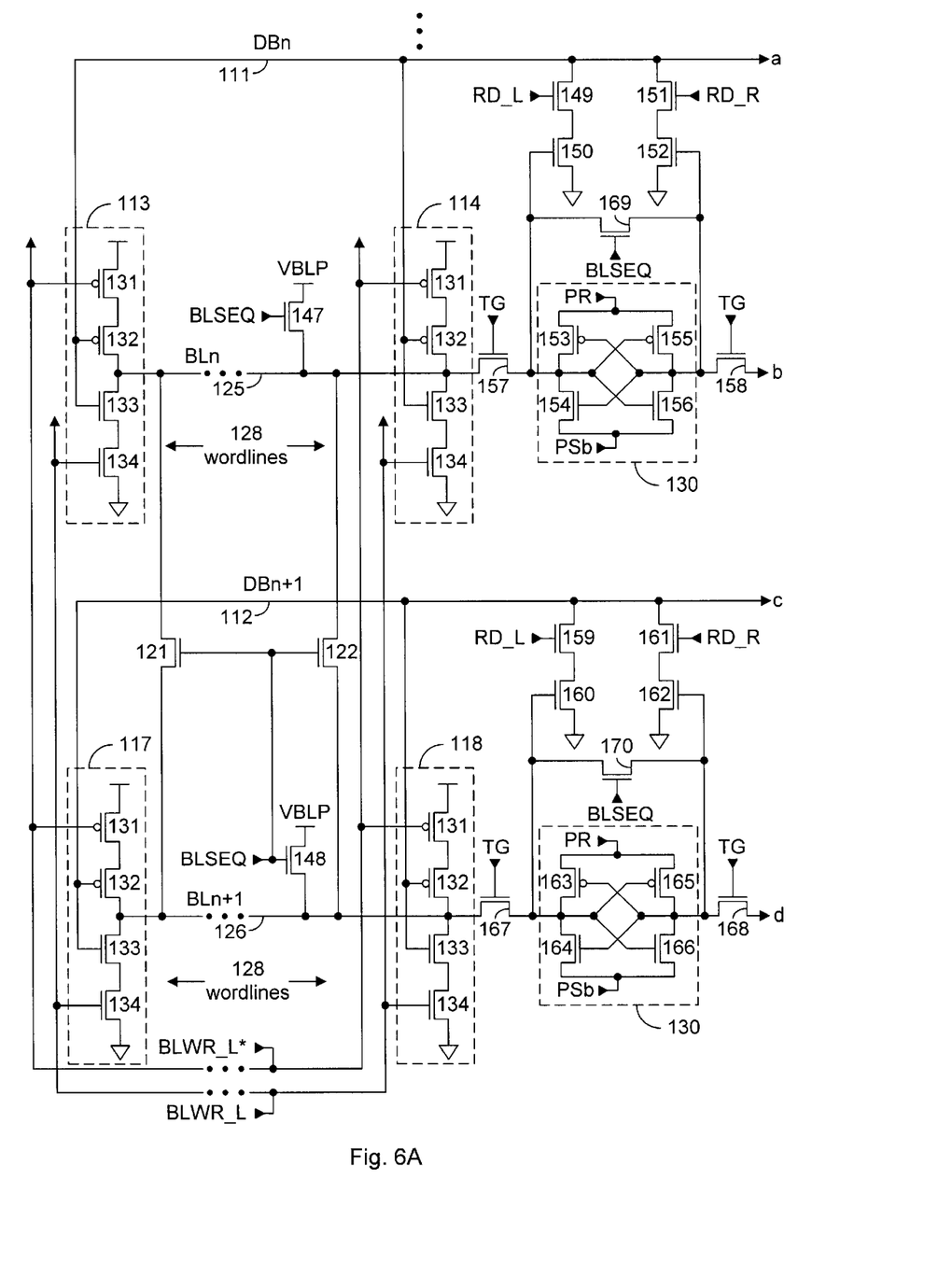
FIGS. 6A and 6B show a detailed circuit schematic of the bitline precharge and equalize architecture of FIG. 5; and, FIG. 7 shows a schematic of a local bitline overwrite circuit.
Figure 6B:
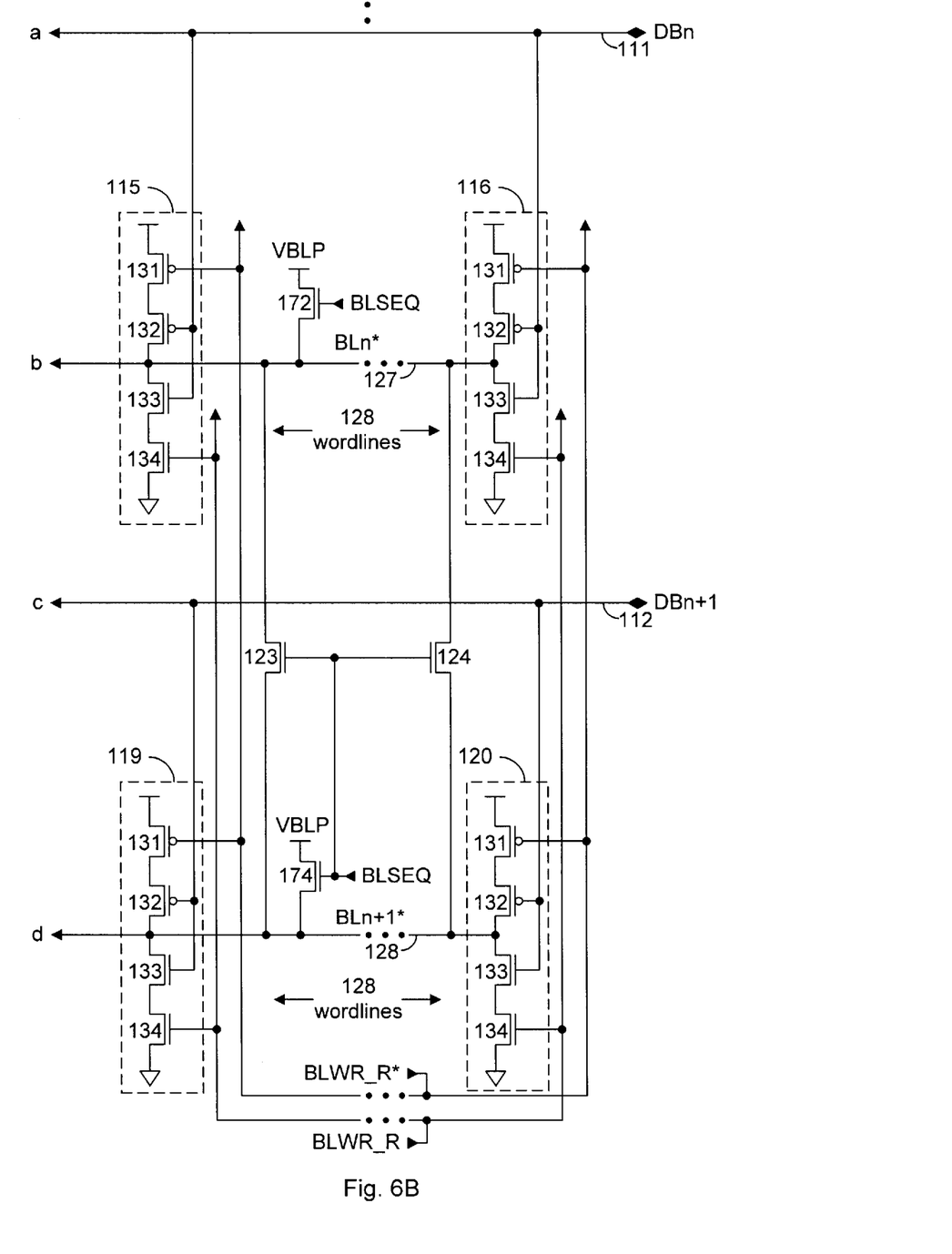

FIG. 5 shows a general circuit diagram of the hybrid architecture of the present invention. Various control signals, wordlines and read circuits are omitted to simplify the schematic. A more detailed circuit diagram showing the omitted elements of the hybrid architecture is shown in FIGS. 6A and 6B. One row 110 of ternary CAM cells and associated equalization circuits is shown in FIG. 5, where an array can contain a plurality of rows 110 arranged in column, and a plurality of columns arranged side by side. In the present embodiment of FIG. 5, row 110 includes a pair of databuses DBn and DBn+1denoted by reference numerals 111 and 112 respectively, tri-state inverters 113, 114, 115, 116, 117, 118, 119 and 120, two pairs of first and second bitlines BLn, BLn* and BLn+1, BLn+1* denoted by reference numerals 125, 127 and 126, 128 respectively, equalization transistors 121, 122, 123 and 124, ternary CAM cells 140 and bitline sense amplifiers 130. Bitlines 125 and 127 are configured in the open bitline architecture with respect to their BLSA 130, and bitlines 126 and 128 are configured in the open bitline architecture with respect to their BLSA 131. Each pair of first and second bitlines, BLn, BLn* and BLn+1, BLn+1*, do not necessarily carry only complementary data during read operations. However, BLn and BLn+1 are a complementary pair of bitlines as are BLn* and BLn+1*. Subscipt n can be any integer number greater than 0. The tri-state inverters function as bitline write drivers, where tri-state inverters 113, 114, 117 and 118, bitlines 125 and 126 and equalization transistors 121 and 122 are part of the left sub-array of row 110, and tri-state inverters 115, 116, 119 and 120, bitlines 127 and 128 and equalization transistors 123 and 124 are part of the right sub-array of row 110.

Because each ternary CAM cell 140 stores two bits of information, two bitlines are required for transferring data into and out of the cell, as previously shown in the CAM cell schematic of FIG. 2. Therefore, when data is read out from an accessed cell, one bit of data is asserted onto a first bitline, BLn or BLn+1, and another bit of data is asserted onto a second bitline, BLn* or BLn+1*. Each complementary bitline pair is connected to its own bitline sense amplifier for amplifying and reading its potential level. In row 110, BLn and BLn+1 are the first and second bitlines respectively for the ternary CAM cells of the left sub-array, and correspondingly, BLn+1 and BLn+1* are the first and second bitlines respectively for the ternary CAM cells of the right sub-array.

Equalization transistors 121 and 122 have gates connected to the left bitline equalization signal BLSEQ_L, and have source/drain terminals connected between BLn and BLn+1. Equalization transistors 121 and 122 are positioned at opposite ends of bitlines BLn and BLn+1 with ternary CAM cells 140 positioned between them. Tri-state inverters 113 and 114 drive data from databus 111 onto bitline 125, and tri-state inverters 117 and 118 drive data from databus 112 onto bitline 126. Tri-state inverters 113, 114, 117 and 118 are enabled by complementary signals BLWR_L and BLWR_L*. The configuration of the elements previously mentioned for the left sub-array of row 110 are mirrored by their corresponding elements for the right sub-array of row 110. Equalization transistors 123 and 124 have gates connected to right bitline equalization signal BLEQ_R, and have their source/drain terminals connected between BLn* and BLn+1*. Equalization transistors 123 and 124 are also positioned at opposite ends of bitlines BLn* and BLn+1* with ternary CAM cells 140 positioned between them. Tri-state inverters 115 and 116 drive data from databus 111 onto bitline 127, and tri-state inverters 119 and 120 drive data from databus 112 onto bitline 128. Tri-state inverters 115, 116, 119 and 120 are enabled by complementary signals BLWR_R and BLWR_R*.

Because each complementary pair of bitlines is configured in the open bitline architecture with respect to its bitline sense amplifier, a read operation from the hybrid bitline architecture of FIG. 5 is executed similarly to the read operation described for the open bitline architecture of FIG. 3. Therefore, a description of the general read operation for the hybrid bitline architecture of FIG. 5 is not necessary. A detailed description of the read operation follows in the description for the detailed hybrid bitline architecture of FIGS. 6A and 6B.

The precharge and equalize operation for the hybrid bitline architecture of FIG. 5 is described below. After a read operation, the bitline sense amplifiers 130 drive their respective bitlines to complementary logic potential levels, hence all four bitlines of row 110 are held at either the high or low logic potential levels. Table 1 below illustrates the four possible logic potential levels of the bitlines of row 110 after a read operation is completed.

TABLE 1

| Case | BLn logic level | BLn + 1 logic level | BLn* logic level | BLn + 1* logic level |
| --- | --- | --- | --- | --- |
| 1 | 1 | 0 | 1 | 0 |
| 2 | 0 | 1 | 1 | 0 |
| 3 | 1 | 0 | 0 | 1 |
| 4 | 0 | 1 | 0 | 1 |

To precharge the bitlines to a mid-point potential level by equalization in a folded manner, all first and second bitlines must have complementary logic potential levels. More specifically, BLn and BLn+1 of the left sub-array can have complementary logic potential levels, and the bitline BLn* and BLn+1* of the right sub-array can have complementary logic potential levels prior to turning on the equalization transistors. From Table 1 above, the bitlines in cases 2 and 3 can be equalized. In other words, if equalization transistors 121, 122, 123 and 124 are turned on by their respective control signals BLSEQ_L and BLSEQ_R when the bitlines have the logic potential levels shown in cases 2 and 3, charge sharing will occur and all the bitlines will equalize to a mid-point potential level between the high and low logic potential levels. Therefore, the precharge time of the hybrid bitline architecture is equivalent to the precharge time of traditional DRAM folded bitline architectures. However, the bitlines in cases 1 and 4 cannot be equalized because the first and second bitlines of the left and right sub-arrays have similar logic potential levels.

To allow equalization of the bitlines under all four cases according to the present invention, the first and second bitlines of both sub-arrays are overturned, or overwritten with preset complementary logic potential levels from the databuses DBn and DBn+1 prior to equalization. For example, a high logic potential level can be written onto databus DBn and a low logic potential level can be written onto databus DBn+1 after the read operation. Therefore, BLn and BLn* are driven to the low logic potential level via tri-state inverters 113, 114, 115 and 116, and BLn+1 and BLn+1* are driven to the high logic potential level via tri-state inverters 117, 118, 119 and 120. Now that all first and second bitlines have complementary logic potential levels, equalization transistors 121, 122, 123 and 124 are turned on and all bitlines of the left and right sub-arrays equalize to a mid-point potential level. Alternatively, the logic potential levels written onto databuses DBn and DBn+1 can be reversed to drive complementary logic level potential levels onto the first and second bitlines. Although not shown, overwrite circuitry including global write drivers can be configured to write the preset data onto the databuses, or additional drivers can be directly connected to the databuses. However, there are several methods for writing preset data to the databuses, which should be apparent to those skilled in the art.

A detailed circuit diagram of the hybrid bitline architecture according to an embodiment of the present invention is shown in FIGS. 6A and 6B. Wordlines and memory cells are not shown to simplify the schematic. But it will be understood by those skilled in the art that the wordlines would run perpendicular to the bitlines and the memory cells would be located at the intersection of each wordline and bitline. Many elements shown in FIG. 5 correspond with elements of FIGS. 6A and 6B having the same reference numerals. FIGS. 6A and 6B illustrate the read, write and precharge circuits associated with one row of ternary CAM cells. A plurality of such rows can be arranged in a column, and a plurality of columns can be arranged side by side in a CAM memory array. In the present embodiment, the first and second bitlines of the left and right sub-arrays of the row are each connected to 128 ternary CAM cells. It is noted that the number of cells connected to each pair of first and second bitlines depends on the desired size of the memory array, thus alternate embodiments could have more or less than 128 ternary CAM cells per pair of first and second bitlines. The hybrid bitline architecture of FIGS. 6A and 6B includes bitline read circuitry, bitline write circuitry and bitline precharge circuitry. The internal nodes labelled a, b, c and d in FIG. 6A are connected to the same labelled nodes in FIG. 6B.

The bitline read circuitry for BLn and BLn+1 includes bitline sense amplifier 130, transfer gates 157 and 158 and databus read drivers 149, 150 and 151, 152. Bitline sense amplifier 130 includes a pair of cross-coupled inverters. A first inverter includes p-channel transistor 153 and n-channel transistor 154 serially connected between restore voltage PR and sense voltage PSb. A second inverter includes p-channel transistor 155 and n-channel transistor 156 serially connected between restore voltage PR and sense voltage PSb. PR and PSb are controlled internal high and low power supply voltages, respectively, for all the bitline sense amplifiers 130. The output of the first inverter is connected to a first terminal of n-channel transfer gate 157 and the output of the second inverter is connected to a first terminal of n-channel transfer gate 158. Transfer gates 157 and 158 are controlled by signal TG, for connecting the bitline sense amplifier 130 to bitlines BLn and BLn* at their respective second terminals during a read operation. A first databus read driver includes n-channel transistors 149 and 150 serially connected between DBn and VSS. The gate of transistor 149 is connected to a read left sub-array signal RD_L, and the gate of transistor 150 is connected to the output of the first inverter of bitline sense amplifier 130. A second databus read driver includes n-channel transistors 151 and 152 serially connected between DBn and VSS. The gate of transistor 151 is connected to a read right sub-array signal RD_R, and the gate of transistor 152 is connected to the output of the second inverter of bitline sense amplifier 130. Bitline read circuitry for BLn+1 and BLn+1* are configured identically to the bitline read circuitry for BLn and BLn* previously described. Transistors 163, 164, 165 and 166 of the bitline sense amplifier 130 correspond with transistors 153, 154, 155 and 156 respectively. Transfer gates 167 and 168 correspond with transistors 157 and 158 respectively. Databus read driver transistors 159, 160 and 161, 162 correspond with transistors 149, 150 and 151, 152 respectively.

The bitline write circuitry includes tri-state inverters 113, 114, 115, 116, 117, 118, 119 and 120. Generally, two tri-state inverters drive databus data onto each bitline, where each tri-state inverter has p-channel transistors 131 and 132 serially connected between the voltage supply VDD and a bitline, and n-channel transistors 133 and 134 serially connected between the bitline and the voltage supply VSS, or ground. Enabling transistors 131 and 134 of each tri-state inverter have gates connected to a bitline write signal and a complementary bitline write signal. A complementary pair formed by transistors 132 and 133 of each tri-state inverter have gates connected to its respective databus. A more detailed description of the tri- state inverters follows. Tri-state inverter 113 is connected to bitline BLn at approximately the farthest position from the bitline sense amplifier 130, and tri-state inverter 114 is connected to bitline BLn at approximately the closest position from the bitline sense amplifier 130. Both tri-state inverters 113 and 114 have enabling transistors 131 and 134 connected to left sub-array write signal BLWR_L* and its complement BLWR_L respectively, and have their complementary pair of transistors 132 and 133 connected to databus DBn. Tri-state inverters 117 and 118 are connected to bitline BLn+1 at the same positions as tri-state inverters 113 and 114 connected to bitline BLn. Both tri-state inverters 117 and 118 also have enabling transistors 131 and 134 connected to left sub-array write signal BLWR_L* and its complement BLWR_L respectively, but have their complementary pair of transistors 132 and 133 connected to databus DBn+1. Tri-state inverters 115, 116 and 119, 120 are similarly connected to their respective bitlines BLn* and BLn+1*. The enabling transistors 131 and 134 of tri-state inverters 115, 116, 119 and 120 are connected to right sub-array write signal BLWR_R* and its complement BLWR_R respectively. The complementary pair of 132 and 133 of tri-state inverters 115, 116 and 119, 120 are connected to databuses DBn and DBn+1 respectively.

The bitline precharge circuitry includes n-channel equalization transistors 121, 122, 123, 124, 169 and 170, and n-channel bitline precharge transistors 147, 148, 172 and 174. Although the tri-state inverters are part of the write circuitry, they are also a part of the bitline precharge circuitry in the present embodiment during precharge operations. A description of the precharge circuits for the left sub-array of the row now follows. Equalization transistor 121 has its source/drain terminals connected to BLn and BLn+1 at approximately the farthest position from the bitline sense amplifier 130. Equalization transistor 122 also has its source/drain terminals connected to BLn and BLn+1, but at approximately the closest position from the bitline sense amplifier 130. Thus, equalization transistors are connected at opposite ends of the pair of first and second bitlines. Precharge transistor 147 couples bitline precharge voltage VBLP to BLn and precharge transistor 148 couples bitline precharge voltage VBLP to BLn+1. The precharge transistors can be connected to their respective bitlines at any convenient location along the bitlines. Equalization transistors 123 and 124, and bitline precharge transistors 172 and 174 of the right sub-array are connected to bitlines to BLn* and BLn+1* in the same configuration as described for their corresponding transistors of the left sub-array. Additional equalization transistors 169 and 170 have their source/drain terminals connected to the outputs of their respective bitline sense amplifier cross-coupled inverters. All the equalization transistors and precharge transistors have their gates connected to a bitline equalization signal BLSEQ.

The following description of the read, write and precharge operations are made with reference to FIGS. 5, 6A and 6B, and more specifically, the circuits connected to bitlines BLn and BLn+1.

The read operation for the hybrid bitline architecture of the present invention is similar to the read operation for the open bitline architecture described in FIG. 3. It is assumed that bitlines BLn and BLn+1 have been precharged to the mid-point potential level, and databus DBn has been precharged to the high potential level after a previous operation. Signals RD_L and RD_R are inactive at the low logic potential level, and signal TG is at the high logic potential level to connect the bitline sense amplifiers to their respective bitlines. Signals PR and PSb are held at a midpoint potential level of the bitlines. To read data from the bitlines, one wordline from either the left or right sub-array is activated to access one of 128 ternary CAM cells connected to each pair of first and second bitlines. If the ternary CAM cell of FIG. 2 is used in the array, the active wordline would be driven to VPP, a potential level higher than VDD. Depending on the stored data in the accessed CAM cell, charge is either added to its corresponding bitline to increase its potential level above the mid-point potential level, or removed from its corresponding first bitline to decrease its potential level below the mid-point potential level. It is noted that the bitline of the unaccessed sub-array remains at the precharged mid-point potential level since no wordline in that sub-array is activated, and hence serves as a reference bitline for bitline sense amplifier 130. Bitline sense amplifier voltages PR and PSb are driven to their respective internal high and low potential levels to activate the bitline sense amplifier. Bitline sense amplifier 130 then compares the accessed bitline to the reference potential level of the reference bitline. If the accessed bitline has a potential level less than the reference potential level, then the logic "0", or low potential level is latched. Alternatively, if the accessed bitline has a potential level greater than the reference potential level, then the logic "1", or high potential level is latched. Accordingly, once bitline sense amplifier 130 latches the data of the accessed bitline, the reference bitline is driven to the opposite logic level. A bitline driven to the high potential level by bitline sense amplifier 130 turns on its respective read transistor, 150 or 152. Signal TG is driven to the low logic potential level shortly after signals PR and PSb are driven to their respective high and low potential levels. Once the transfer gate transistors are turned off, BLSA latching is completed without being loaded by the bitline capacitance. Depending on the sub-array being accessed, either read left sub-array signal RD_L or either read right sub-array signal RD_R is driven to the high potential level to turn on read enable transistors 149 or 151 respectively. If a pair of serially connected read enable and read transistors, 149 and 150 for example, are turned on, then DBn is discharged to ground. Otherwise, DBn remains at the precharged high potential level. Tri-state inverters 113, 114, 115 and 116 are turned off during the bitline read access operation by driving signals BLWR_L*, BLWR_R* to the high potential level and signals BLWR_L, BLWR_R to the low potential level. However, the tri-state inverters can be turned on at the end of the read operation to restore the bitline potential to the VDD supply rail. This particular feature of the circuit is described in further detail later. Although the previous description of the read operation has been made with reference to the circuits connected to bitlines BLn and BLn+1, the same description also applies to the circuits connected to bitlines BLn* and BLn+1*.

Writing data to the bitlines does not involve the previously described read circuitry, but still requires activation of one wordline from either the left or right sub-array in order to access one of 128 ternary CAM cells connected to each pair of first and second bitlines. Transfer gates 157 and 158 and read enable transistors 149 and 151 are turned off during the write operation to isolate the bitline sense amplifier 130 from bitlines BLn and BLn+1 and databus DBn. It is assumed that bitlines BLn and BLn+1 have been precharged to the mid-point potential level, databus DBn has been driven with high or low potential level write data from global write drivers (not shown), and sub-array bitline write signals BLWR_L*, BLWR_R* and BLWR_L, BLWR_R are at the high and low potential levels respectively to keep tri-state inverters 113, 114, 115 and 116 initially turned off. Depending on the potential level of DBn, one of transistors 132 and 133 of tri-state inverters 113 and 114 is turned on. A pair of complementary sub-array write signals associated with the active wordline, BLWR_L*, BLWR_L or BLWR_R*, BLWR_R are subsequently driven to the low and high potential levels respectively. Therefore only tri-state inverters 113, 114 or 115, 116 are turned on to drive write data from DBn onto bitlines BLn or BLn+1 respectively. Depending on the potential level of DBn, a high or low potential level is driven onto the bitlines. Although the previous description of the write operation has been made with reference to the circuits connected to bitlines BLn and BLn+1, the same description also applies to the circuits connected to bitlines BLn* and BLn+1*.

Following a read or write operation, the bitline are precharged to the mid-point potential level in preparation for a subsequent read operation. Transfer gates 157 and 158 are initially turned off and read enable transistors 149 and 151 remain turned off during the precharge operation to isolate the bitline sense amplifier 130 from bitlines BLn and BLn+1 and databus DBn. Bitline sense amplifier voltages PR and PSb are driven to the mid-point potential level to disable the bitline sense amplifiers. Databuses DBn and DBn+1 are first driven by the global write drivers with preset complementary logic potential levels, followed by activation of the left and right sub-array tri-state inverters and transfer gates 157, 158, 167 and 168. In other words, signals BLWR_L*, BLWR_R* and BLWR_L, BLWR_R are driven to the low and high potential levels respectively, and signal TG is driven to the high potential level. Therefore, previous logic potential levels on the bitlines from the previous read/write operation are overwritten, or overturned with the preset logic potential levels. For example, if DBn and DBn+1 are driven to the high and low potential levels respectively, then bitlines BLn, BLn* are driven to the low potential level via tri-state inverters 113, 114, 115 and 116, and bitlines BLn+1, BLn+1* are driven to the high potential level via tri-state inverters 117, 118, 119 and 120. The tri-state inverters remain active until all bitlines are fully driven to their final complementary levels. Then signals BLWR_L*, BLWR_R* and BLWR_L, BLWR_R are driven to the high and low potential levels respectively to disable the tri-state inverters. At this point, bitline equalization can occur. Bitline equalization signal BLSEQ and transfer gate signal TG are then driven to the high potential level to turn on the precharge circuitry and the transfer gates. Specifically, equalization transistors 121, 122, 123, 124, 169 and 170 are turned on to short all four bitlines together, and transfer gates 157, 158, 167 and 168 are turned on so that the complementary bitline pairs are coupled together via equalization transistors 169 and 170. All four bitlines eventually equalize to the mid-point potential level through charge sharing. Precharge transistors 147, 148 172 and 174 are also turned on to couple bitline precharge voltage VBLP to all the bitlines, to hold the bitlines at the mid-point VBLP potential level. VBLP is a mid-point potential level produced from a voltage generator which is not shown.

The hybrid bitline architecture of the present invention has several advantages over the bitline architectures of the prior art. The precharge operation is executed in a manner consistent with folded bitline architectures, and hence about four times faster than for traditional open bitline architectures having the same length bitlines because of the additional equalization transistors connected at the opposite ends of each pair of first and second bitlines. Since the bitlines are initially precharged to the mid-point potential level via equalization, a VBLP generator designed with less restrictions can be used to maintain the mid-point potential levels on the bitlines. The open bitline architecture allows for maximum packing efficiency of ternary dynamic CAM cells within an array to keep area consumption and consequently costs, low.

Although databuses DBn and DBn+1 are shown as being in parallel with the bitlines, alternate embodiments can have DBn and DBn+1 formed as segments connected to global databuses formed perpendicularly to the segments.

Figure 7:
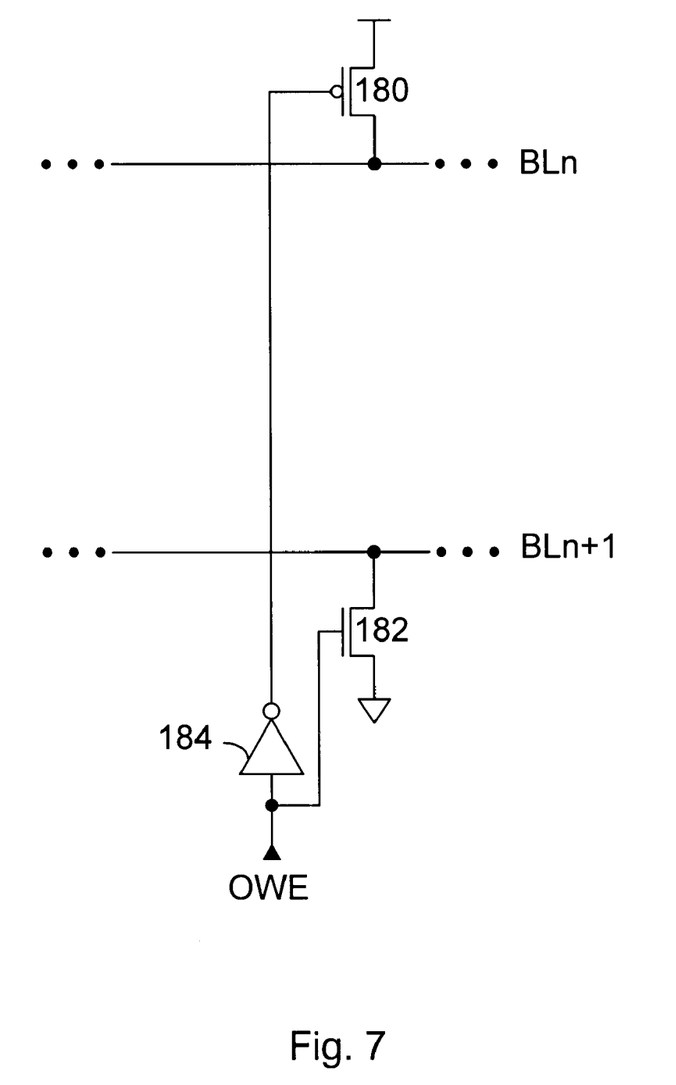

In another alternate embodiment of the present invention shown in FIG. 7, additional local overwrite circuits are connected to the bitlines for driving the bitlines to the predetermined data potential levels instead of using the write drivers and databuses for writing the predetermined data to the bitlines. Bitlines BLn and BLn+1 are shown in FIG. 7, where p-channel overwrite transistor 180 couples VDD to BLn and n-channel overwrite transistor 182 couples ground to BLn+1. The gate of transistor 182 and the input of inverter 184 is connected to overwrite enable signal OWE, and the gate of transistor 180 is connected to the output of inverter 184. Therefore, when OWE is driven to the high potential level, transistor 180 is turned on to drive BLn to the high potential level and transistor 182 is turned on to drive BLn+1 to the low potential level of ground. Although bitlines BLn* and BLn+1* are not shown, transistors corresponding to overwrite transistors 180 and 182 can be connected to bitlines BLn* and BLn+1* with the same configuration. Accordingly, a logic pattern of 1, 1, 0, 0 corresponding to bitlines BLn, BLn*, BLn+1 and BLn+1* is respectively driven in this particular configuration of the overwrite transistors. Alternatively, the overwrite transistors can be connected to drive each of the four bitlines with alternating high and low logic potential levels. In this alternate configuration, a logic pattern of 1,0,0,1 corresponding to bitlines BLn, BLn*, BLn+1 and BLn+1* is obtained. In both overwrite transistor configurations, there exists a respective opposite configuration for which precharging to a mid-point potential level via equalization is still possible. The various bitline logic level patterns previously discussed are summarized in Table 2 below.

TABLE 2

| Configuration | BLn logic level | BLn + 1 logic level | BLn* Logic level | BLn + 1* logic level |
| --- | --- | --- | --- | --- |
| 1 | 1 | 1 | 0 | 0 |
| 2 | 0 | 0 | 1 | 1 |
| 3 | 1 | 0 | 0 | 1 |
| 4 | 0 | 1 | 1 | 0 |

The hybrid bitline architecture of the present invention suffers from high power consumption when first and second bitlines already having complementary logic potential levels are overwritten with the opposite complementary logic potential levels prior to equalization.

In an alternative embodiment of the present invention, the bitlines can be restored during a read operation by activating the write drivers of the appropriate sub-array shortly after the bitline data is read and asserted onto the databuses. By using the write drivers to restore the bitline potential levels instead of the bitline sense amplifier p-channel transistors, higher speed operations are achieved.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A bitline architecture for a ternary content addressable memory, comprising:
    a first bitline sense amplifier connected to first and second complementary bitlines arranged in an open bitline configuration;
    a second bitline sense amplifier connected to third and fourth complementary bitlines arranged in an open bitline configuration;
    ternary content addressable memory cells for storing two bits of data connected to the first and third bitlines;
    ternary content addressable memory cells for storing two bits of data connected to the second and fourth bitlines;
    a first bitline overwrite circuit for writing preset complementary logic potential levels onto the first and third bitlines;
    a second bitline overwrite circuit for writing preset complementary logic potential levels onto the second and fourth bitlines;
    a first precharge circuit for equalizing the first and third bitlines; and
    a second precharge circuit for equalizing the second and fourth bitlines.

2. The bitline architecture of claim 1, wherein the first and second bitline sense amplifiers include CMOS cross coupled inverters.

3. The bitline architecture of claim 1, wherein the ternary content addressable memory cells are ternary DRAM type CAM cells.

4. A content addressable memory array, comprising:

content addressable memory cells arranged in rows and columns, each cell having a first and second bitlines; a bitline overwrite circuit for each pair of first and second bitlines for writing preset complementary logic potential levels onto the first and second bitlines;

an equalization circuit for each pair of first and second bitlines for shorting together the first and second bitlines after the preset complementary logic potential levels are written onto the first and second bitlines;

an address decoder for addressing rows of cells;

write data circuitry for writing data to the cells; and read circuitry for reading data from the cells.

5. A method for precharging first and second bitlines in a content addressable memory; comprising the steps of:

(i) writing preset complementary logic potential levels onto the first and second bitlines; and (ii) equalizing the first and second complementary bitlines.

* * * * *